United States Patent [19]
Liao

[11] Patent Number: 5,995,433
[45] Date of Patent: Nov. 30, 1999

[54] THREE-TRANSISTOR TYPE DRAM WITH A REFRESH CIRCUIT

[75] Inventor: Hung-Jen Liao, Tou Liu, Taiwan

[73] Assignee: Taiwan Semiconductor Manufacturing Co., Ltd., Hsinchu, Taiwan

[21] Appl. No.: 09/083,437

[22] Filed: May 22, 1998

[51] Int. Cl.$^6$ ........................................ G11C 7/00
[52] U.S. Cl. .............................. 365/222; 365/150
[58] Field of Search ................................ 365/222, 149, 365/150

[56] References Cited

U.S. PATENT DOCUMENTS

| | | | |
|---|---|---|---|
| 4,044,342 | 8/1977 | Suzuki et al. | 365/222 |
| 4,935,896 | 6/1990 | Matsumura et al. | 365/222 |
| 5,262,988 | 11/1993 | Ochii | 365/222 |
| 5,414,657 | 5/1995 | Okimura | 365/149 |
| 5,812,476 | 9/1998 | Segawa | 365/222 |

*Primary Examiner*—Tan T. Nguyen
*Attorney, Agent, or Firm*—Harold L. Novick; Nath & Associates

[57] ABSTRACT

A three-transistor type dynamic random access memory (DRAM) with a refresh circuit is disclosed. The memory includes a memory array including memory cells (40), each of the memory cells having a storing transistor (M2) used for storing a data therein; a writing transistor (M1) responsive to a signal on a write word line for transferring a signal on a write bit line to the storing transistor; and a reading transistor (M3) responsive to a signal on a read word line for transferring the data in the storing transistor to a read bit line. The memory according to the present invention also includes a refresh circuit (50) configured to latch a signal on the read bit line, the latched signal then being coupled to the write bit line when the refresh circuit is activated.

17 Claims, 5 Drawing Sheets

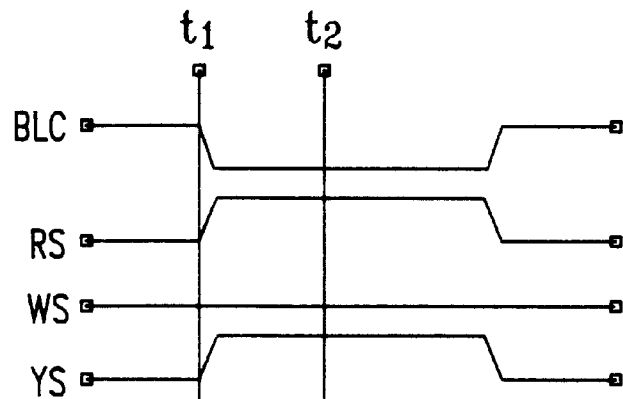
FIG.5A  READ
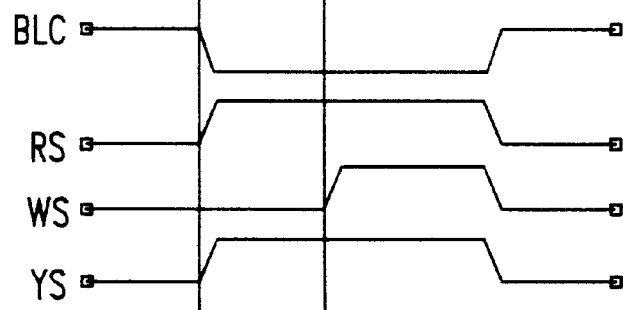
FIG.5B  WRITE
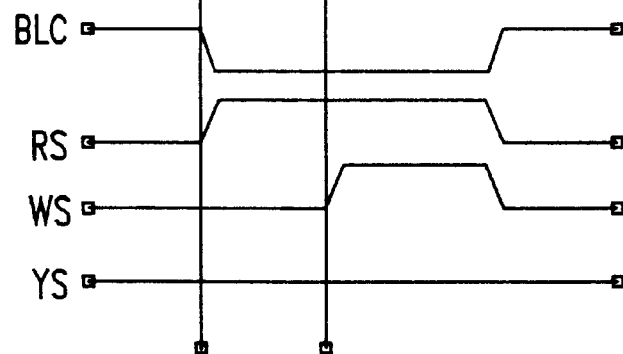
FIG.5C  REFPESH

THREE-TRANSISTOR TYPE DRAM WITH A REFRESH CIRCUIT

BACKGROUND OF THE INVENTION

1. Field of the Invention

The present invention relates to a dynamic random access memory (DRAM), and particularly to a three-transistor type DRAM with a refresh circuit.

2. Description of the Prior Art

Three-transistor type memory cell is conventionally used in constructing dynamic random access memories (DRAMs) in integrated circuits, and particularly in application-specific integrated circuits (ASICs). FIG. 1 shows a schematic diagram of the three-transistor memory cell 20 including a transistor M2 for storing an information signal, a transistor M1 responsive to a signal on a write word line WS for transferring a data signal from a buffer 22 to the transistor M2, and another transistor M3 responsive to a signal on a read word line RS for transferring the information signal to a sense amplifier 23. Compared to another conventional four-transistor type memory cells primarily used in static random access memories (SRAMs), the three-transistor DRAM cell has its relative simplicity in both design and operation due to the fact that it can be manufactured by existing logic processes and no extra complicated pumping circuits are required. Further, the readout operation in the three-transistor DRAM cell is non-destructive, and is suitable to be used as two-port random access memory cell.

More specifically, the three-transistor cell 20 is written to by placing an appropriate data value (or information signal) on a write bit line WD and asserting the write word line WS. The data is then retained as charge on capacitance (not shown) coupled to the gate of the transistor M2. When data reading is commencing, the read word line RS is first raised, and the storage transistor M2 is either on or off depending on the stored valued therein. In other words, the series connection of the transistors M2 and M3 pulls the read bit line RD low when a charge (i.e., data 1) is stored in the transistor M2; otherwise, the read bit line RD remains high when no charge (i.e., data 0) is stored in the transistor M2. Furthermore, Y decoding switch is usually used for selecting one path through which data is written in and readout, especially when the memory configuration becomes larger.

FIG. 2 shows a schematic diagram of a conventional three-transistor DRAM 100, which is disclosed in the background description of a U.S. Pat. No. 4,935,896 to Matsumura et al., and is hereby incorporated by reference. As shown in the figure, one additional AND gate 12 should be inserted before each write word line WWL to avoid turning on the write word line WWL whose corresponding Y switch is off. Otherwise, the floating write bit line WB will probably disturb the stored value in the un-written cell.

For the three-transistor type DRAM cells, since some gate circuits, such as the AND gates 12, for selecting a memory cell to which information signal is to be written is required, the scale of a memory circuit becomes large, thereby occupying more area. Moreover, because the gate circuit 12 generally includes complementary metal-oxide-semiconductor (CMOS) transistors, a latch-up effect may incurred, temporarily or permanently failing the memory circuit.

The aforementioned U.S. Patent proposes a folded bit line architecture in the write path, which can also be used to refresh the data stored in each cell. FIG. 3 shows a schematic diagram of the three-transistor DRAM 300, wherein a pair of write bit lines $WB_1$ and $WB_2$ is used. This scheme offers solutions preserving cell density, however at the cost of a more complex circuit design. Particularly, the floor plan in laying out the memory cells should be carefully arranged to avoid being heavily loaded by the write bit lines $WB_1$ and $WB_2$. Further, the sense amplifiers 30 do not work if the capacitance between write bit lines $WB_1$ and $WB_2$ is large enough and the signal difference therebetween becomes too small. Accordingly, a need has been arisen to invent a three-transistor DRAM keeping the advantage of high cell density and offering flexibility of floor plan.

SUMMARY OF THE INVENTION

In accordance with the present invention, a three-transistor type DRAM with a refresh circuit is provided to substantially increase cell density and offer flexibility of floor plan. In one embodiment, the DRAM includes a memory array including some memory cells (40), each of the memory cells having a storing transistor (M2) used for storing a data therein; a writing transistor (M1) responsive to a signal on a write word line (WS) for transferring a signal on a write bit line (WD) to the storing transistor; and a reading transistor (M3) responsive to a signal on a read word line (RS) for transferring the data in the storing transistor to a read bit line (RD). The present invention also includes a refresh circuit (50) configured to latch a signal on the read bit line, the latched signal being then coupled to the write bit line when the refresh circuit is activated. The refresh circuit includes a P type transistor (M4); a first N type transistor (M5), gate of the P type transistor and gate of the first N type transistor being connected as an input terminal of the refresh circuit connected to the read bit line, drain of the P type transistor and drain of the N type transistor being connected as the output terminal of the refresh circuit connected to the write bit line; and a second N type transistor (M6) connected in serial with the first N type transistor, wherein the refresh circuit is activated when the second N type transistor turns on. Some load transistors (42) are connected to the read bit line for charging the signal on the read bit line. Further, some switch pairs are used to control communication to and from the memory cell, the switch pairs being turned off when the refresh circuit is activated, wherein each of the switch pairs comprises a first passgate (440) and a second passgate (442), one terminal of the first passgate being connected to the write bit line, and one terminal of the second passgate being connected to the read bit line. Finally, a write buffer (46) is connected to another terminal of the first passgate, and a read circuit (48) is connected to another terminal of the second passgate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 5A, 5B, and 5C illustrate timing diagrams for the operation of reading, writing, and refreshing, respectively, of the memory array according to the embodiment of the present invention.

DESCRIPTION OF THE PREFERRED EMBODIMENT

Figure 1:
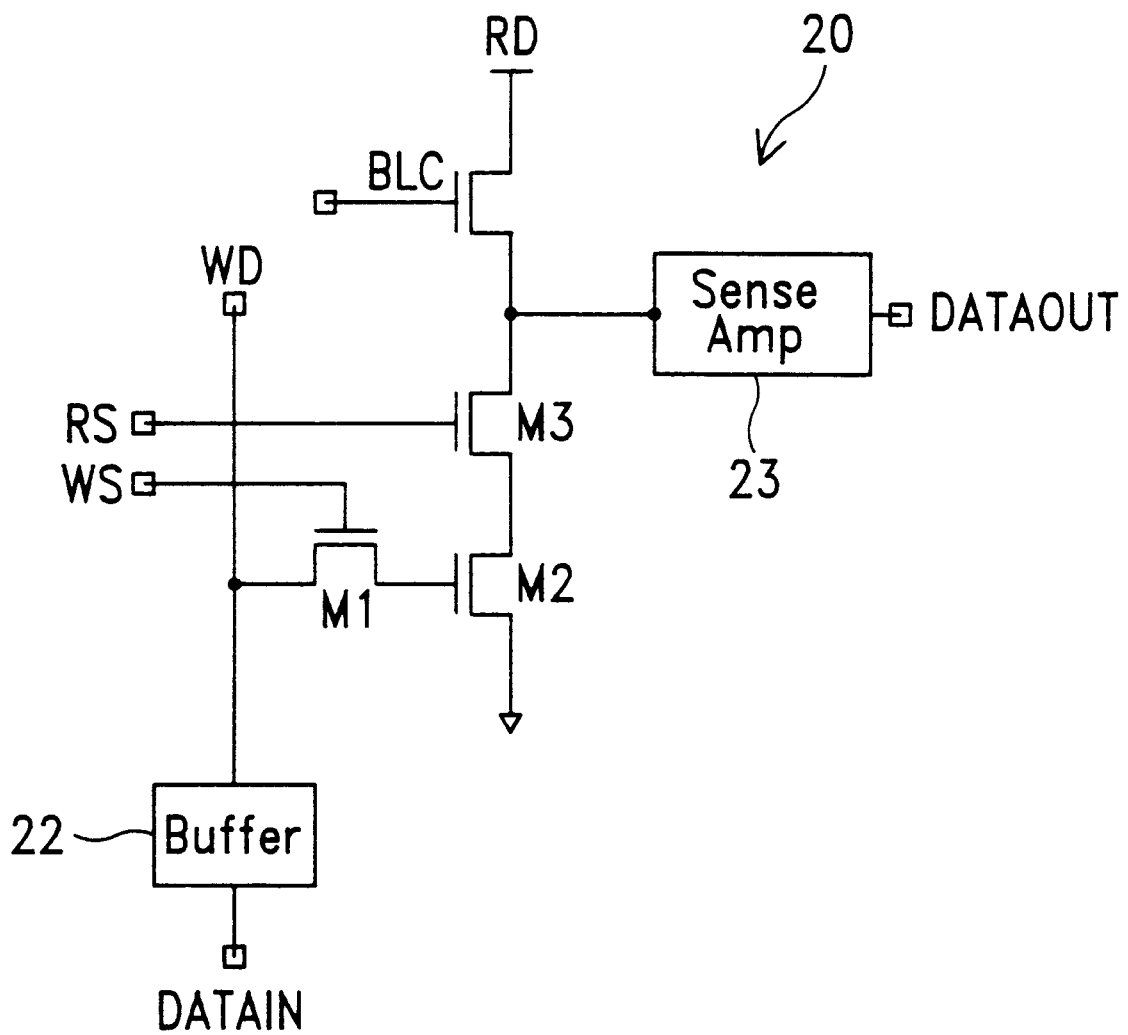
FIG. 1 shows a schematic diagram of a conventional three-transistor memory cell.
Figure 2:
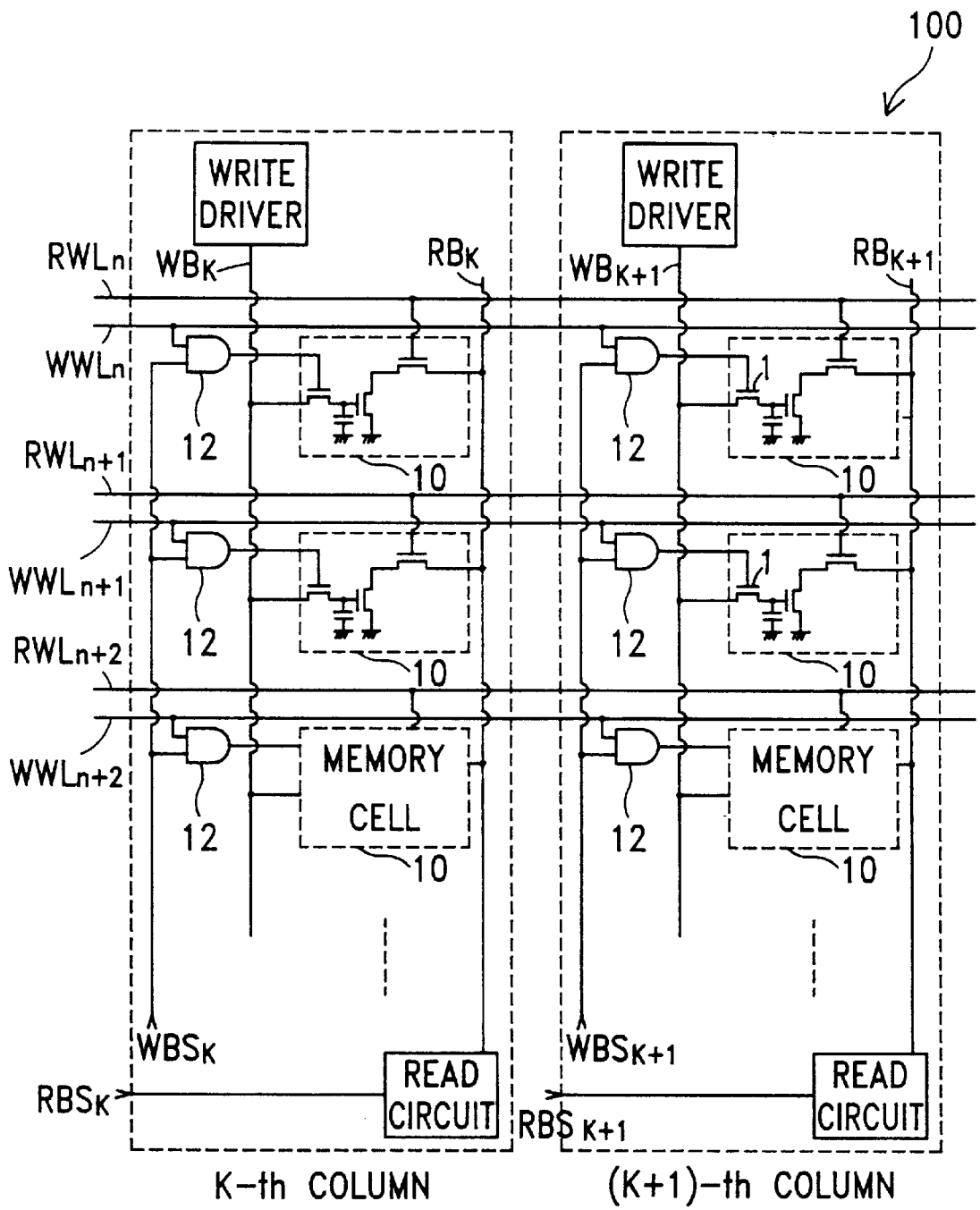
FIG. 2 shows a schematic diagram of a conventional three-transistor DRAM.
Figure 3:
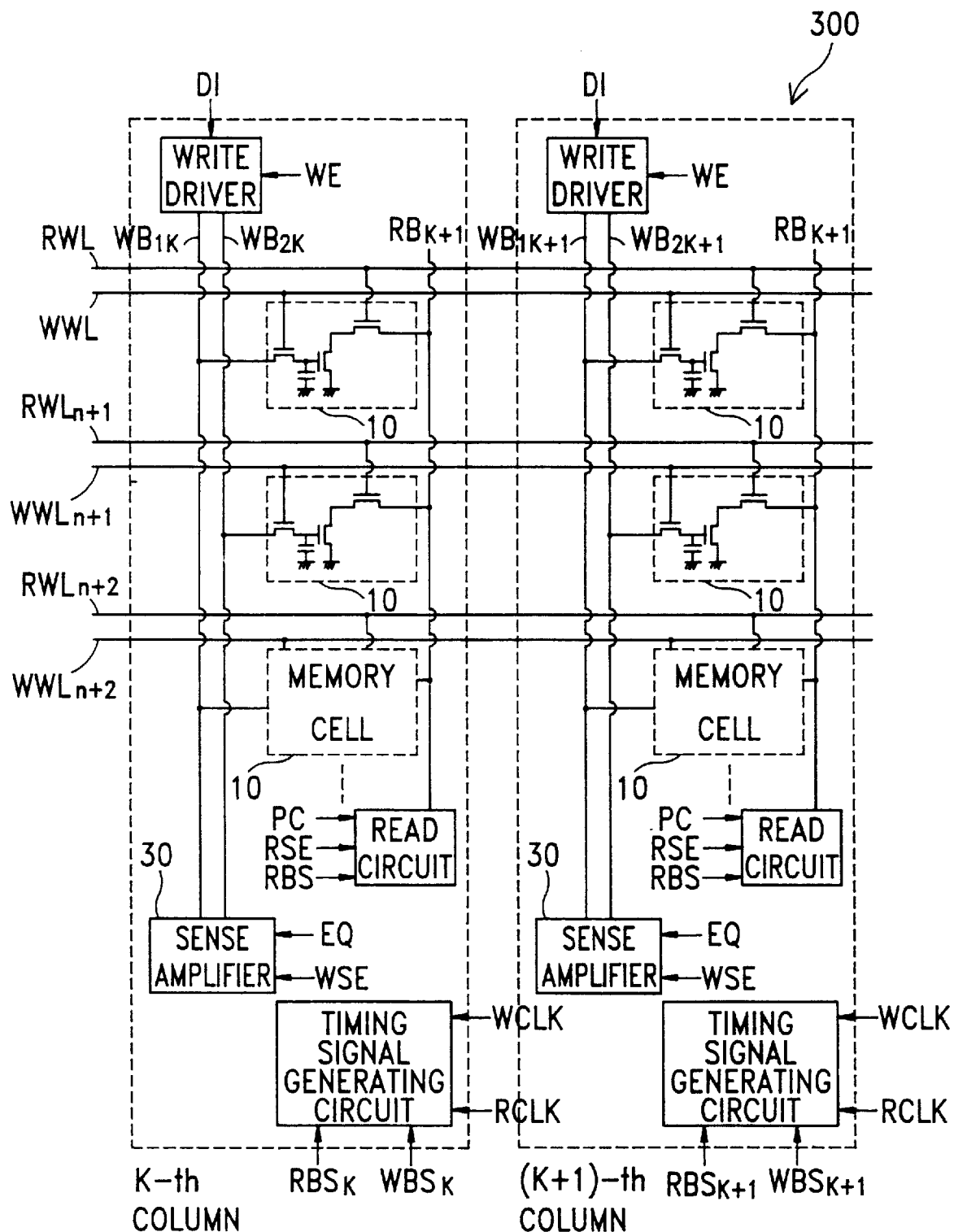
FIG. 3 shows a schematic diagram of another conventional three-transistor DRAM.
Figure 4:
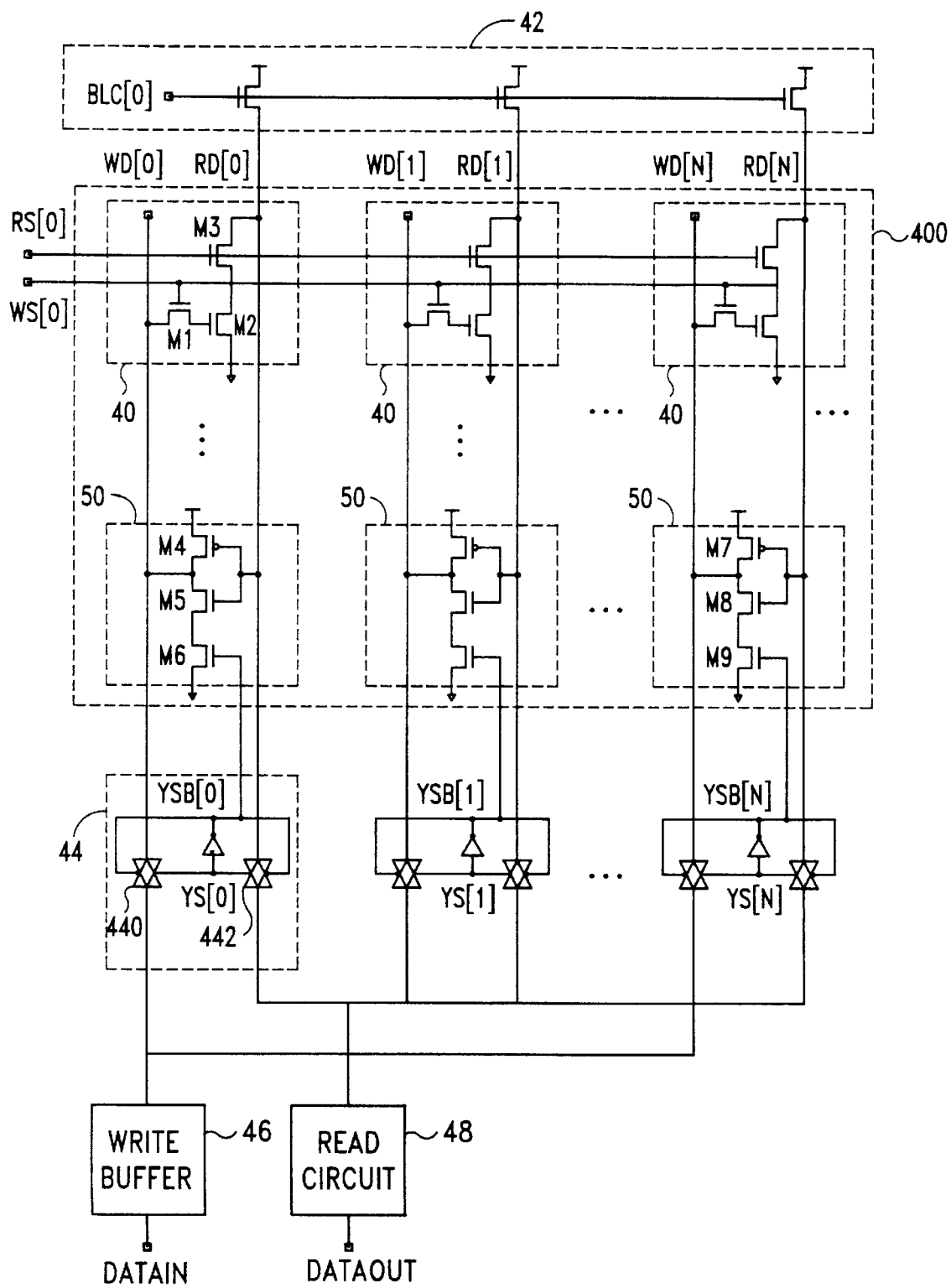
FIG. 4 shows a schematic diagram illustrating a memory array of a dynamic random access memory (DRAM) including some three-transistor memory cells according to one embodiment of the present invention.

FIG. 4 shows a schematic diagram illustrating a memory array 400 of a dynamic random access memory (DRAM) including some three-transistor memory cells 40 according to one embodiment of the present invention. Each memory cell 40, for example, considering the memory cell 40 in the first row and in the first column, includes three transistors M1, M2, and M3. The transistor M2 is used to store an information signal (or a data); the transistor M1 responsive to a signal on a write word line WS[0] is used to transfer a data signal on a write bit line WD[0] to the transistor M2; and the transistor M3 responsive to a signal on a read word line RS[0] is used to transfer the information signal to a read bit line RD[0]. In this embodiment, each of the transistors M1, M2, and M3 is an N channel metal-oxide-semiconductor (MOS) field effect transistor. The transistor M2 has its gate connected to the write bit line WD[0] through the transistor M1, has its drain connected to the read bit line RD[0] through the transistor M3, and has its source connected to ground. The transistor M1 has its gate connected to the write word line WS[0]. The transistor M3 has its gate connected to the read word line RS[0]. It is further noted that the read bit line RD[O] is connected to one of bit line load transistors 42.

Still referring to FIG. 4, some Y decoding switch pairs 44 are used to select one path through which data is written in from a write buffer 46 and readout to a read circuit 48. Each Y decoding switch pair 44 includes two passgates (or transmission gates) 440 and 442 controlled by a control signal YS and its inverted counterpart YSB. For example, when the control signal YS becomes high, these passgates 440 and 442 turn on for the purpose of data writing or reading; otherwise, when the control signal YS becomes low, these passgates 440 and 442 turn off for other purpose of, for example, refreshing.

The refresh circuit 50 as shown in the circuit of FIG. 4 is one of main features of the present invention. The purpose of the refresh circuit 50 is to latch data out of the read bit line RD, and then communicate the latched data to the write bit line WD, for example, during the refresh mode (which will be described later). The refresh circuit 50 primarily includes an inverter having a transistors M4 (a P channel MOS field effect transistor in this embodiment) and a transistor M5 (an N channel MOS field effect transistor in this embodiment), wherein the gate of the respective transistors M5, M4 are connected as the input terminal, and the drain of the respective transistors M5, M4 are connected as the output terminal. Further, the refresh circuit 50 also includes a transistor M6 (an N channel MOS field effect transistor in this embodiment) used to activate the refresh circuit 50. For example, during the refresh mode, the Y decoding switch pair 44 turns off with high inverted control signal YSB, which turns on (or activates) the transistor M6 and the refresh circuit 50. Furthermore, during the reading operation of the memory array 400, the refresh circuit 50 is disabled without fear of losing any data because the reading operation in the three-transistor memory cell 40 is non-destructive.

FIGS. 5A, 5B, and 5C illustrate timing diagrams for the operation of reading, writing, and refreshing, respectively, of the memory array 400 according to the embodiment of the present invention. In the description explained below, the memory cell 40 located at word line 0, column (or bit line) 0 is discussed, while it is appreciated that the same explanation can be applied to other locations as well. In the read mode, the read bit line RD[0] is precharged to high by its corresponding bit line load transistor 42 before time t1. At time t1, read word line RS[0] changes to high as shown in FIG. 5A, and the gate (designated as BLC) of bit line load transistor 42 changes to low to turn it off. Assuming data 0 is previously stored in the transistor M2, the voltage of the read bit line RD[0] then remains high. On the contrary, if data 1 is previously stored, the voltage of the read bit line RD[0] will go low by pulling the read bit line RD[0] to ground through the transistors M3 and M2. Finally, the signal of the read bit line RD[0] will pass to the read circuit 48 via the passgate 442 turned on by the control signal YS[0].

In the write mode, the read bit line RD[0] is precharged to high by its corresponding bit line load transistor 42 before time t1. At time t1, read word line RS[0] changes to high as shown in FIG. 5B, and the gate (designated as BLC) of bit line load transistor 42 changes to low to turn it off. Assuming data 0 is previously stored in the transistor M2, the voltage of the read bit line RD[0] then remains high. On the contrary, if data 1 is previously stored, the voltage of the read bit line RD[0] will go low by pulling the read bit line RD[0] to ground through the transistors M3 and M2. At time t2, write word line WS[0] changes to high, and the data from the write buffer 46 is written to write bit line WD[0] via the passgate 440 controlled by the control signal YS[0]. It is noted that while the control signal YS[0] is high and the its inverted counterpart YSB[0] is low, the transistor M6 in the refresh circuit 50 is off. Consequently, the selected memory cell is prohibited from being refreshed. However, other memory cells unselected are refreshed by their corresponding refresh circuit 44 because these refresh circuit 44 are activated under a high inverted control signal YSB.

Finally, the operation principle of refresh is almost the same as that in the write mode, except that all passgates 44 are off in this refresh mode. The read bit line RD[0] is precharged to high by its corresponding bit line load transistor 42 before time t1. At time t1, read word line RS[0] changes to high as shown in FIG. 5C, and the gate (designated as BLC) of bit line load transistor 42 changes to low to turn it off. Assuming data 0 is previously stored in the transistor M2, the voltage of the read bit line RD[0] then remains high. On the contrary, if data 1 is previously stored, the voltage of the read bit line RD[0] will go low by pulling the read bit line RD[0] to ground through the transistors M3 and M2. At time t2, write word line WS[0] changes to high, and the latched signal from the refresh circuit 50 will be refreshed into the memory cell 40.

Although specific embodiments have been illustrated and described, it will be obvious to those skilled in the art that various modifications may be made without departing from what is intended to be limited solely by the appended claims.

What is claimed is:

1. A dynamic random access memory with a refresh circuit, wherein said memory comprises:
   a memory array including a plurality of memory cells, each of said memory cells having:
      a storing transistor used for storing a data therein;
      a writing transistor responsive to a signal on a write word line for transferring a signal on a write bit line to the storing transistor; and
      a reading transistor responsive to a signal on a read word line for transferring the data in the storing transistor to a read bit line; and a refresh circuit configured to latch a signal on the read bit line, the latched signal then being coupled to the write bit line when said refresh circuit is activated, wherein said refresh circuit includes:

an inverter having an input terminal connected to the read bit line, and an output terminal connected to the write bit line; and a control circuit connected in serial with said inverter, said refresh circuit being activated when said control circuit turns on.

2. The memory according to claim 1, wherein said inverter comprises a P type transistor and a first N type transistor, gate of said P type transistor and gate of said first N type transistor being connected as the input terminal of the refresh circuit, drain of said P type transistor and drain of said first N type transistor being connected as the output terminal of the refresh circuit.

3. The memory according to claim 1, wherein said control circuit comprises a second N type transistor.

4. The memory according to claim 1, further comprising a plurality of load transistors connected to the read bit line for charging the signal on the read bit line.

5. The memory according to claim 1, further comprising a plurality of switch pairs for controlling communication to and from the memory cell, said switch pairs being turned off when said refresh circuit is activated.

6. The memory according to claim 5, wherein each of said switch pairs comprises a first passgate and a second passgate, one terminal of said first passgate being connected to the write bit line, and one terminal of said second passgate being connected to the read bit line.

7. The memory according to claim 6, further comprising a write buffer connected to another terminal of said first passgate.

8. The memory according to claim 7, further comprising a read circuit connected to another terminal of said second passgate.

9. A dynamic random access memory with a refresh circuit, wherein said memory comprising:

a memory array including a plurality of memory cells, each of said memory cells having:
a storing transistor used for storing a data therein;
a writing transistor responsive to a signal on a write word line for transferring a signal on a write bit line to the storing transistor; and
a reading transistor responsive to a signal on a read word line for transferring the data in the storing transistor to a read bit line;

a refresh circuit configured to latch a signal on the read bit line, the latched signal being then coupled to the write bit line when said refresh circuit is activated, said refresh circuit includes:
a P type transistor;
a first N type transistor, gate of said P type transistor and gate of said first N type transistor being connected as an input terminal of the refresh circuit connected to the read bit line, drain of said P type transistor and drain of said N type transistor being connected as the output terminal of the refresh circuit connected to the write bit line; and
a second N type transistor connected in serial with said first N type transistor, said refresh circuit being activated when said second N type transistor turns on;

a plurality of load transistors connected to the read bit line for charging the signal on the read bit line;

a plurality of switch pairs for controlling communication to and from the memory cell, said switch pairs being turned off when said refresh circuit is activated, wherein each of said switch pairs comprises a first passgate and a second passgate, one terminal of said first passgate being connected to the write bit line, and one terminal of said second passgate being connected to the read bit line;

a write buffer connected to another terminal of said first passgate; and a read circuit connected to another terminal of said second passgate.

10. A dynamic random access memory with a refresh circuit, wherein said memory comprises:

a memory array including a plurality of memory cells, each of said memory cells having:

a storing transistor used for storing a data therein;

a writing transistor responsive to a signal on a write word line for transferring a signal on a write bit line to the storing transistor; and a reading transistor responsive to a signal on a read word line for transferring the data in the storing transistor to a read bit line;

a refresh circuit configured to latch a signal on the read bit line, the latched signal then being coupled to the write bit line when said refresh circuit is activated; and a plurality of switch pairs for controlling communication to and from the memory cell, said switch pairs being turned off when said refresh circuit is activated.

11. The memory according to claim 10, wherein said refresh circuit comprises:

an inverter having an input terminal connected to the read bit line, and an output terminal connected to the write bit line; and a control circuit connected in serial with said inverter, said refresh circuit being activated when said control circuit turns on.

12. The memory according to claim 11, wherein said inverter comprises a P type transistor and a first N type transistor, gate of said P type transistor and gate of said first N type transistor being connected as the input terminal of the refresh circuit, drain of said P type transistor and drain of said first N type transistor being connected as the output terminal of the refresh circuit.

13. The memory according to claim 12, wherein said control circuit comprises a second N type transistor.

14. The memory according to claim 10, further comprising a plurality of load transistors connected to the read bit line for charging the signal on the read bit line.

15. The memory according to claim 10, wherein each of said switch pairs comprises a first passgate and a second passgate, one terminal of said first passgate being connected to the write bit line, and one terminal of said second passgate being connected to the read bit line.

16. The memory according to claim 15, further comprising a write buffer connected to another terminal of said first passgate.

17. The memory according to claim 16, further comprising a read circuit connected to another terminal of said second passgate.

* * * * *